(12) United States Patent
Zhou et al.

(10) Patent No.: US 11,856,689 B2
(45) Date of Patent: Dec. 26, 2023

(54) POWER ELECTRONICS ASSEMBLIES AND METHODS OF FABRICATING THE SAME

(71) Applicant: Toyota Motor Engineering & Manufacturing North America, Inc., Plano, TX (US)

(72) Inventors: Feng Zhou, Ann Arbor, MI (US); Yanghe Liu, Ann Arbor, MI (US); Hiroshi Ukegawa, South Lyon, MI (US); Ercan Dede, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 0 days.

(21) Appl. No.: 17/587,255

(22) Filed: Jan. 28, 2022

(65) Prior Publication Data
US 2023/0284377 A1     Sep. 7, 2023

(51) Int. Cl.
*H05K 1/02*      (2006.01)
*H05K 7/20*      (2006.01)

(52) U.S. Cl.
CPC ....... *H05K 1/0272* (2013.01); *H05K 7/20509* (2013.01)

(58) Field of Classification Search
CPC .......... H05K 1/0272; H05K 7/20509
See application file for complete search history.

(56) References Cited

U.S. PATENT DOCUMENTS

| | | | |
|---|---|---|---|
| 4,989,070 A | 1/1991 | Iverson et al. | |
| 5,111,280 A | 5/1992 | Iverson | |
| 5,168,919 A | 12/1992 | Berenholz et al. | |
| 5,675,473 A | 10/1997 | McDunn et al. | |
| 8,482,919 B2 | 7/2013 | Dede | |
| 8,929,080 B2 | 1/2015 | Campbell et al. | |
| 9,852,963 B2 | 12/2017 | Shedd et al. | |
| 9,980,415 B2 | 5/2018 | Zhou et al. | |
| 10,334,756 B1* | 6/2019 | Dede | H01L 23/473 |
| 2021/0176896 A1* | 6/2021 | Yang | H05K 7/20254 |

OTHER PUBLICATIONS

Johann Schnur et al., "Design and Fabrication of PCB Embedded Power Module with Integrated Heat Exchanger for Dielectric Coolant", CIPS 2018—10th International Conference on Integrated Power Electronics Systems, Mar. 20-22, 2018, pp. 400-405, VDE Verlag Gmbh, Germany.

* cited by examiner

*Primary Examiner* — Mukundbhai G Patel
(74) *Attorney, Agent, or Firm* — Dinsmore & Shohl LLP

(57) ABSTRACT

Disclosed herein are power electronics assemblies which include a printed circuit board (PCB) having a plurality of conductive layers and a cold plate contacting the PCB. The cold plate includes a manifold constructed from an electrically insulating material and including a first cavity and a second cavity. The cold plate further includes a first heat sink positioned in the first cavity and thermally coupled to the plurality of conductive layers. The cold plate further includes a second heat sink positioned in the second cavity and thermally coupled to the plurality of conductive layers.

18 Claims, 17 Drawing Sheets

US 11,856,689 B2

POWER ELECTRONICS ASSEMBLIES AND METHODS OF FABRICATING THE SAME

TECHNICAL FIELD

The present specification generally relates to power electronics assemblies and methods of fabricating the same and, more specifically, to power electronics assemblies integrated with cooling components.

BACKGROUND

Due to the increased use of electronics in vehicles, there is a need to make electronic systems more compact. One of the components of these power electronic assemblies are power device-embedded printed circuit boards (PCBs). Power device-embedded PCBs may require extensive cooling due to the heat generated by the power devices. To meet such cooling requirements, cold plates may be used.

Traditionally, electrical insulation layers are placed between the cold plates and the PCBs to electrically isolate the power devices embedded in the PCB. The electrical insulation layers and thermal interface material (TIM) placed on the electrical insulation layers increase the size and total thermal resistance of the PCB.

SUMMARY

In one embodiment, an apparatus for power electronics assembly includes a printed circuit board (PCB) having a plurality of conductive layers and a cold plate contacting the PCB. The cold plate includes a manifold constructed from an electrically insulating material and including a first cavity and a second cavity. The cold plate further includes a first heat sink positioned in the first cavity and thermally coupled to the plurality of conductive layers. The cold plate further includes a second heat sink positioned in the second cavity and thermally coupled to the plurality of conductive layers.

In another embodiment, an apparatus for power electronics assembly for a vehicle cooling system includes a printed circuit hoard (PCB) having a plurality of conductive layers and a cold plate contacting the PCB. The cold plate includes an inlet fluidly coupled to a dielectric coolant source. The cold plate further includes a manifold constructed from an electrically insulating material and includes a first cavity, a second cavity, and a coolant pocket. The cold plate further includes a first heat sink positioned in the first cavity and thermally coupled to the plurality of conductive layers and to the coolant pocket. The cold plate further includes a second heat sink positioned in the second cavity and thermally coupled to the plurality of conductive layers and to the coolant pocket. The cold plate further includes an outlet fluidly coupled to the coolant pocket.

In yet another embodiment, methods for fabricating a power electronics assembly includes creating a first cavity and a second cavity into a manifold of a cold plate and constructed from an electrically insulating material. The method further includes placing a first heat sink into the first cavity. The method further includes placing a second heat sink into the second cavity. The method further includes placing a plurality of conductive layers onto a printed circuit hoard (PCB). The method further includes placing the PCB into contact with the cold plate.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1A:
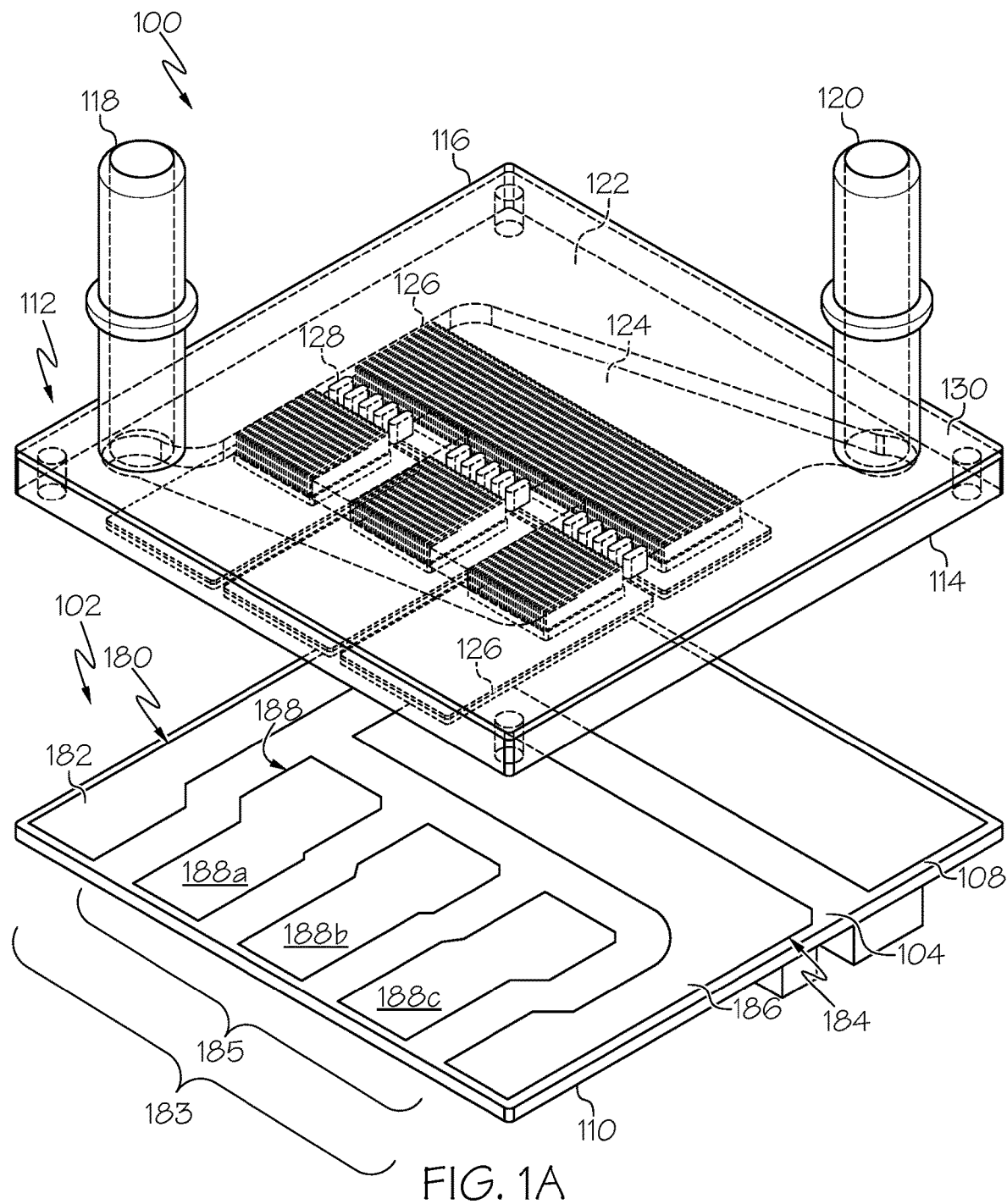
FIG. 1A schematically depicts an exploded perspective view of an illustrative power electronics assembly including a printed circuit hoard (PCB) with a plurality of conductive layers and a cold plate having heat sinks, according to one or more embodiments shown and described herein.

Embodiments described herein are directed to a power electronics assemblies that include a printed circuit board (PCB) having a plurality of conductive layers, as well as a cold plate in contact with the PCB. The cold plate has a manifold constructed from an electrically insulating material and cavities in which heat sinks are positioned within. The heat sinks are thermally coupled to the plurality of conductive layers. The power electronics assemblies described herein avoids or minimizes the need for electrical insulation layers and/or reduce overall thermal resistance. Due to the decreased thermal resistance, the cooling process is more efficient, thereby allowing for the cold plate to be thinner, which results in an overall compact package size that offers improved cooling capabilities. In embodiments, the power electronics assemblies described herein utilize dielectric coolants and can be integrated into other cooling systems that also utilize dielectric coolants, such as a motor cooling system (e.g., in-wheel motor) or the like.

Various embodiments of the method and apparatus and the operation of the method and apparatus are described in more detail herein. Whenever possible, the same reference numerals will be used throughout the drawings to refer to the same or like parts.

Traditional power device embedded PCB configurations may require electric insulation layers between the PCB and the cold plate in order to electrically isolate power devices of varying voltages from each other. When using electric insulation layers, thermal insulation material (TIM) may also be used on one or more sides of the electric insulation layer to enhance the cooling rate from the PCB to the cold plate. The addition of electric insulation layers and TINI layers can result in increased total thermal resistance of the PCB. Due to the high heat flux from power devices and poor heat spreading within the PCB and in increased total thermal resistance due to the additional layers, traditional power electronic assemblies suffer from inferior cooling capabilities. Accordingly, the power electronics assembly outputs a lower power output due to the inferior cooling capacity to cool the power devices. Additionally, these additional layers add to the package size of the power electronics assembly configuration, which limits the locations in which the power electronics assembly may be installed (e.g., only certain locations within a vehicle).

Each structure shown and described herein provides advantages over conventional structures (e.g., power electronics assemblies) due to the compact package size, decreased thermal resistance, better flow distribution, which all result in a higher cooling capacity. In addition, the structures shown and described herein may also be deployable in non-traditional spaces and/or be integrated with existing components. For example, the structures shown and described herein may be integrated with a motor cooling system (e.g., in-wheel motors) or other systems that use a dielectric coolant such that the dielectric coolant can be used for more than one purpose.

Referring now to FIGS. an embodiment of a power electronics assembly 100 providing a lower volume profile, increased power density, and lower electrical inductance is generally depicted. In some embodiments, the power electronics assembly 100 is utilized in an electric vehicle, such as, for example, integrated with a motor cooling system of an electric vehicle. In other embodiments, the power electronics assembly 100 is used in an electrically-driven power device, such as, for example, a hybrid vehicle, any electric motor, generators, industrial tools, household appliances, or any other electrically-drive power device requiring a compact package size. The power electronics assembly 100 may generally include a multi-layer printed circuit board (PCB) 102 and a cold plate 112. The PCB 102 may have a first surface 108 and a second surface 110 opposite and parallel to the first surface 108. Mounted to the first and/or second surface 108, 110 of the PCB 102 may be one or more of passive components and/or electrical components, such as logic circuits. The one or more passive components and/or electrical components may include one or more resistors, capacitors, inductors, diodes, oscillators, transistors, integrated circuits, switches, terminals, or the like. The first surface 108 or the second surface 110 may also include one or more terminals for connection to one or more devices as will be described in greater detail herein.

Referring now to FIG. 113, depicts the second surface 110 of the PCB 102 illustrated having a plurality of power terminals The plurality of power terminals may include an N-terminal 160, one or more O-terminals 162 (e.g., U-terminal 162a, V-terminal 162b, and W-terminal 162c), and a P-terminal 164 configured to electrically couple the power electronics assembly 100 to one or more devices (not shown). As will be described below, the power electronics assembly 100 may be operable to convert a type of current from a first current to a second current (e.g., AC to DC, DC to AC, or the like). In some embodiments, it is contemplated that the power electronics assembly 100 may instead be arranged to convert a first voltage to a second voltage. Accordingly, the power electronics assembly 100 may be arranged in a converter topology, an inverter topology, or the like.

Figure 1B:
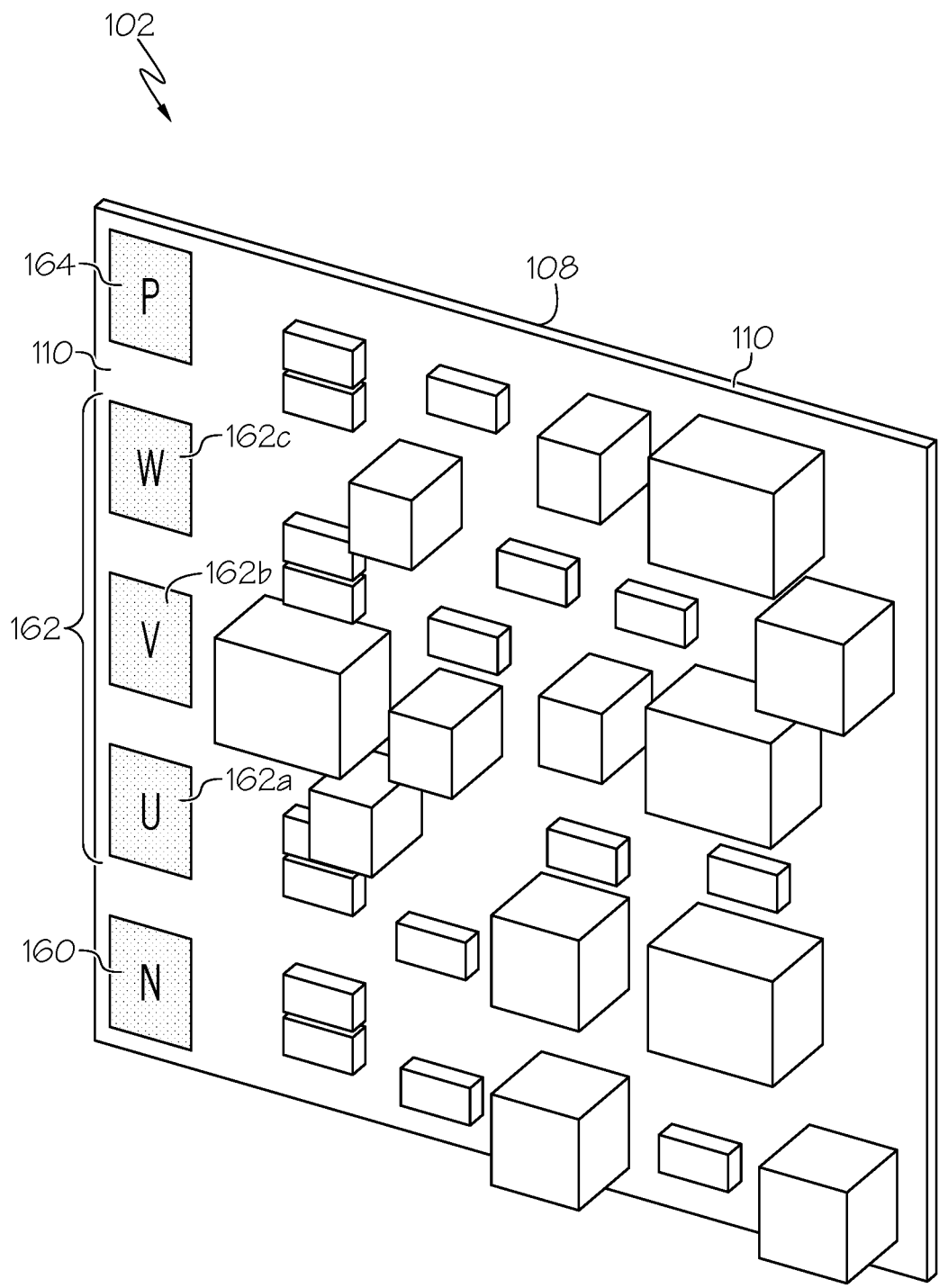
FIG. 1B schematically depicts a first surface of an illustrative PCB having a plurality of power terminals, according to one or more embodiments shown and described herein.
Figure 1C:
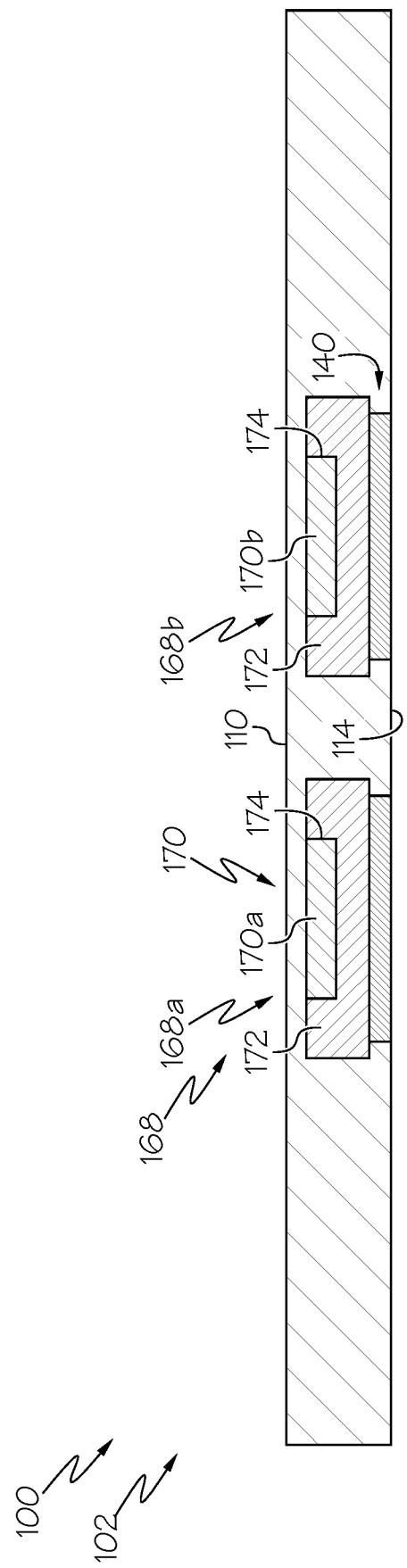
FIG. 1C schematically depicts a cross-section of an illustrative PCB, according to one or more embodiments shown and described herein.

Referring now to FIG. 1C, a cross-section of the PCB 102 is shown without the plurality of passive components and/or electrical components, illustrated in FIG. 1B. As will be described in greater detail herein, and as schematically illustrated in FIG. 1A, one or more cold plates 112 may be mounted to at least one of the first surface 108 of the PCB 102 and the second surface 110. As will also be described in greater detail herein, a plurality of conductive layers 183 arranged within the PCB 102 thermally couples one or more power devices 170 embedded within the PCB 102 to the cold plate 112, such that the cold plate 112 may provide cooling to the one or more power devices 170 by drawing heat away from the one or more power devices 170. The plurality of power devices 170 described herein may include, fir example, one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, at least one of the plurality of power devices may include a wide-bandgap semiconductor, and may be formed from any suitable material such as, but not limited to, silicon carbide (SiC), silicon dioxide ($SiO_2$), aluminum nitride (AlN), gallium nitride (GaN), and boron nitride (BN), and the like. In some embodiments, the plurality of power devices may operate within a power module having a high current and/or a high power (for example, greater than or equal to 5 kW, 10 kW, 20 kW, 30 kW, 40 kW, 50 kW, 60 kW, 70 kW, 80 kW, 90 kW, 100 kW, 110 kW, 120 kW, 130 kW, 140 kW, or 150 kW or any value therebetween) and under high temperatures (for example, in excess of 100° C., 150° C., 175° C., 200° C., 225° C., or 250° C.) and generate a large amount of heat that must be removed for the continued operation of the power module.

Each of the power devices 170 may be part of a power device assembly 168 such that embedded within the PCB 102 are one or more power device assemblies 168 each comprising a conductive substrate 172 and a power device 170 embedded within the conductive substrate 172 (e.g., formed from copper, aluminum, zinc, or the like). For example, a cavity 174 may be formed within the conductive substrate 172 and the power device 170 may be positioned within the cavity 174 and bonded to the conductive substrate 172 (e.g., any conventional bonding techniques such as sintering, soldering, or the like may be used). The one or more power device assemblies 168 may then be embedded within the PCB 102 such that the various conductive layer architectures couple to the one or more power devices 170 (or power device assemblies 168) to achieve the particular topology (e.g., inverter topology, converter topology, or the like). For example, the one or more power device assemblies 168 may include a plurality of power device assemblies 168, which may be arranged in pairs including a first power device assembly 168a and a second power device assembly 168b. For example, in an inverter topology there may be three pairs of power device assemblies 168. In some embodiments, pairs of power device assemblies may be arranged in a parallel topology. For example, an inverter may include one array of power device assemblies 168 including six power device assemblies thereby providing three pairs of power device assemblies. In a parallel topology, two arrays of six power device assemblies may be provided for a total of twelve power device assemblies. Similarly, there may be more than two layers of power device assemblies 168. For example, in another parallel topology, three arrays of six power device assemblies may be provided for a total of eighteen power device assemblies.

The cold plate 112 may include any device or combination of devices that remove heat generated by the one or more power devices 170, as described in greater detail herein. In embodiments, a grease layer may interface between the cold plate 112 and the PCB 102 to reduce thermal resistance and/or increase thermal conductivity by eliminating thermally insulating air pockets which may otherwise form between the PCB 102 and the various layers of the cold plate 112. In embodiments, the grease layer may be electrically insulating to electrically isolate the PCB 102 from the cold plate 112 and may in some embodiments form an electrical insulation layer. The grease layer may include, for example, epoxies, silicones, urethanes, acrylates, metals, metal-alloys, or any combination thereof.

The cold plate 112 may be fixed to the PCB 102 via a plurality of fasteners (e.g., bolts) (not shown) extending through each of the layers of the cold plate 112 and the PCB 102. However, other coupling techniques are contemplated and possible. For example, an external housing or cage (not shown) may mount the cold plate 112 to the PCB 102.

Generally, PCBs are formed from one or more layers of conductive material (e.g., copper, aluminum, silver, nickel, any combination thereof, or the like) etched to form various conductive pathways laminated onto and/or between sheets/layers of non-conductive substrates (e.g., dielectric polymer layers) to form an integral and uniformly thick PCB. The PCB 102 according to the present disclosure includes a plurality of layers laminated together around the one or more power devices 170 such that the one or more power devices 170 are completely encased within the PCB 102 (such as illustrated in FIG. 1C). The plurality of conductive layers 183, as noted above, are disposed on the first side 108 of the PCB 102 and provides both electrical conduction to and from the one or more power devices 170 and thermal conductive between the one or more power devices 170 and the cold plate 112.

FIG. 1A illustrates the first surface 108 of the PCB 102 having a plurality of conductive layers 183. The plurality of conductive layers 183 consist of a bottom N-layer 186, bottom O-layers 188 (including the bottom U-layer 188a, the bottom V-layer 188b, and the bottom W-layer 188c), and bottom P-layer 182, are exposed on the first surface 108, which may be in contact with the cold plate 112 to allow heat transfer through the PCB 102 via the plurality of conductive layers 176 away from the one or more power devices 170 and/or power device assemblies 168.

In the illustrated embodiment, an N-conductive layer architecture 184 is coupled to the first power device 170a or first power device assembly 168a through a first plurality of conductive vias (not shown). An O-conductive layer architecture 185 is coupled to the first power device 170a and/or first power device assembly 168a through a second plurality of conductive vias (not shown). For example, the conductive O-layers 188 may be coupled to a surface of the conductive substrate 172 through a portion of the second plurality of conductive vias. A P-conductive layer architecture 180 is coupled to the second power device 170b through a fourth plurality of conductive vias (not shown). Accordingly, electricity may flow between the power source connected to the N-conductive layer architecture 184 at the N-terminal 160, a top surface of the first power device 170a, the surface of the conductive substrate 172 of the first power device assembly 168a, the O-conductive layer architecture 185 to a top surface of the second power device 170b, and the P-conductive layer architecture 180 at a surface of the of the conductive substrate 172 of the second power device assembly 168b. As illustrated in FIG. 1C, the cold plate 112 may be mounted to the second surface 110 of the PCB 102 such that heat may also conduct through the plurality of conductive layers 176 including each of the N-conductive layer architecture 184, O-conductive layer architecture 185, and P-conductive layer architecture 180 from the one or more power devices 170 to the cold plate 112.

Each of the plurality of power devices 170 may have a particular voltage that is independent of the voltage of the other ones of the plurality of power devices 170 (which may be the same or different). This variability in voltages may necessitate having the power devices electrically isolated from each other. Due to the plurality of power devices 170 being electrically coupled to the plurality of conductive layers 183, each of the plurality of conductive layers 183 may also have a particular voltage correlating to their respective power device. An insulation layer 104 on the first surface 108 may electrically isolate each of the plurality of conductive layers 183 from each other.

Traditional embodiments of power modules fir PCBs may require the power outputs be lowered due to increased thermal resistance from electric insulation layers and TIM layers diminishing the heat flux from the PCB to the cold plate. Accordingly, additional PCBs may be added to meet the power output requirements in traditional embodiments.

However, present embodiments thermally couple the plurality of conductive layers 183 directly to the cold plate 112. As discussed in greater detail herein, this configuration allows for more efficient and effective heat spreading and heat transfer from the plurality of power devices 170 to the heat sinks 126 via the plurality of conductive layers 183. In addition, the elimination of components such as insulation layers increases the compactness of the resulting power electronics assembly 100 (e.g., decreases the overall size of the resulting power electronics assembly 100).

Now generally referring to FIGS. 1-4, the power electronics assembly 100 includes a cold plate 112. The cold plate 112 generally includes a first side 114, a second side 116, an inlet 118, an outlet 120, a manifold 122, a coolant pocket 124, a plurality of heat sinks 126, a plurality of pins 128, and a cover 130. The second side 116 is positioned opposite the first side 114. The cold plate 112 provides cooling to the components of the PCB 102, particularly the plurality of power devices 170 embedded within the PCB 102 via the plurality of conductive layers 183. As such, the cold plate 112 is in contact (e.g., removably coupled to, abuts) the first surface 108.

Coolant is utilized within a cold plate as a medium for the collected thermal energy. In conventional systems, non-dielectric coolant is used due to the coolant having a larger thermal conductivity rate. However, non-dielectric coolant may cause an electrical short in a power electronics assembly when components are not properly electronically isolated from each other, when seals fail, and/or the like. In the present disclosure, dielectric coolant is utilized as the cooling fluid. As compared to conventional systems, dielectric coolants do not carry an electric charge, thereby preventing or rapidly quenching electric discharges. Dielectric coolant may be composed of aliphatics, silicones, fluorocarbons, or the like.

One such dielectric coolant is oil-based coolants, such as those used in cooling systems in electric vehicles. As such, present embodiments may be physically and/or fluidly integrated with other cooling components of a vehicle. For example, in embodiments, the power electronics assembly 100 may be coupled to an electric motor of the electric vehicle. In embodiments, the power electronics assembly is electrically integrated into the electric motor. In embodiments, the power electronics assembly 100 shares (e.g., both are fluidly coupled to) a coolant reservoir with the electric motor. In embodiments, the power electronics assembly 100 are fluidly in series with the electric motor, such that the power electronics assembly 100 outputs or receives dielectric coolant to/from the electric motor. As a result, a more compact size is realized relative to previous systems, as fewer cooling systems can be utilized for cooling the power electronics assembly 100 and other vehicle components.

The inlet 118 and the outlet 120 are configured such that coolant may be introduced through the inlet 118 into the coolant pocket 124 of the manifold 122. The manifold 122 is particularly arranged within the cold plate 112 such that the manifold 122 is in thermal contact with the plurality of conductive layers 106 of the PCB 102, thereby allowing heat transfer to occur with the heat generated by the plurality of power devices 170 at the cold plate 112.

Specifically, the coolant introduced via the inlet 118 flows through the coolant pocket 124 such that the coolant impinges on a surface of the manifold 122 that contacts the PCB 102 and extracts heat therefrom. The coolant may flow out of the manifold 122 through the outlet 120. While not depicted in the figures, the inlet 118 and the outlet 120 may be fluidly coupled to a pump, a condenser, a reservoir, a radiator, and/or other cooling system components. In embodiments using dielectric coolant, the inlet 118 and the outlet 120 are fluidly coupled to other devices that utilize dielectric coolant. For example, the inlet 118 may receive dielectric coolant from another device utilizing dielectric coolant and/or the outlet 120 may provide dielectric coolant to another device which utilizes dielectric coolant. In another example, the inlet 118 may receive dielectric coolant from a coolant reservoir shared with other devices that utilize dielectric coolant and the outlet may provide dielectric coolant to the coolant reservoir shared with other devices that utilize dielectric coolant.

Figure 2:
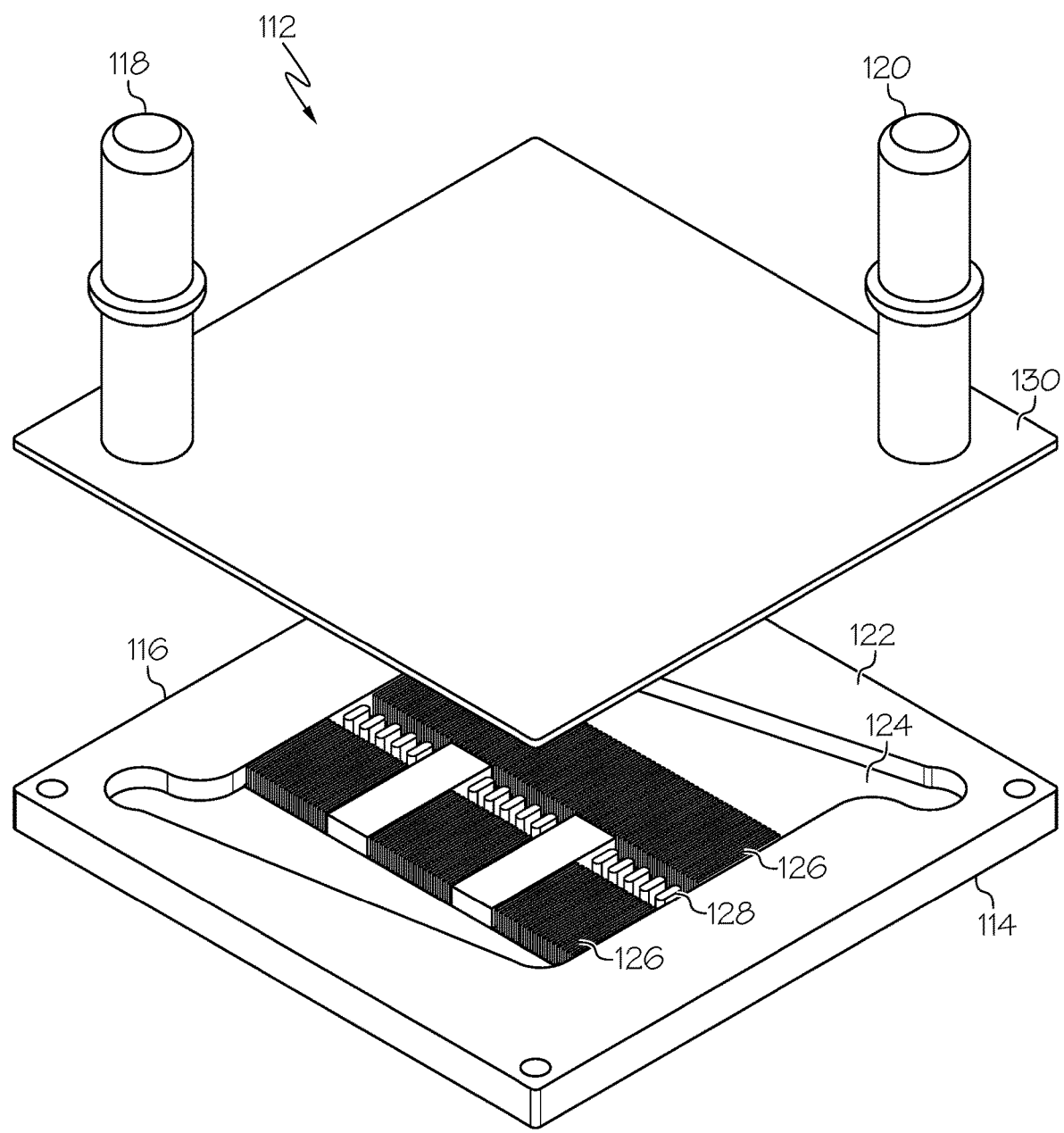
FIG. 2 schematically depicts an exploded perspective view of an illustrative cold plate having a plurality of cavities and heat sinks, according to one or more embodiments shown and described herein.

While FIGS. 1 and 2 depict the inlet 118 and the outlet 120 each generally arranged substantially parallel to each other and extending out of the second side 116 of the cold plate 112, the present disclosure is not limited to such. That is, either or both the inlet 118 and the outlet 120 may extend out of other surfaces of the cold plate 112 in some embodiments.

The coolant within the manifold 122 is contained by the cover 130. Accordingly, the cover 130 extends along a width and length of the manifold 122 and is coupled to (e.g., adhered, fastened) to the manifold 122. The cover 130 may be constructed of aluminum, plastic or the like. In embodiments where the inlet 118 and the outlet 120 extend from second side 116, the cover 130 defines an inlet hole and an outlet hole for the inlet 118 and the outlet 120, respectively. In some embodiments, the manifold 122 may be constructed such that no cover is necessary.

Figure 3:
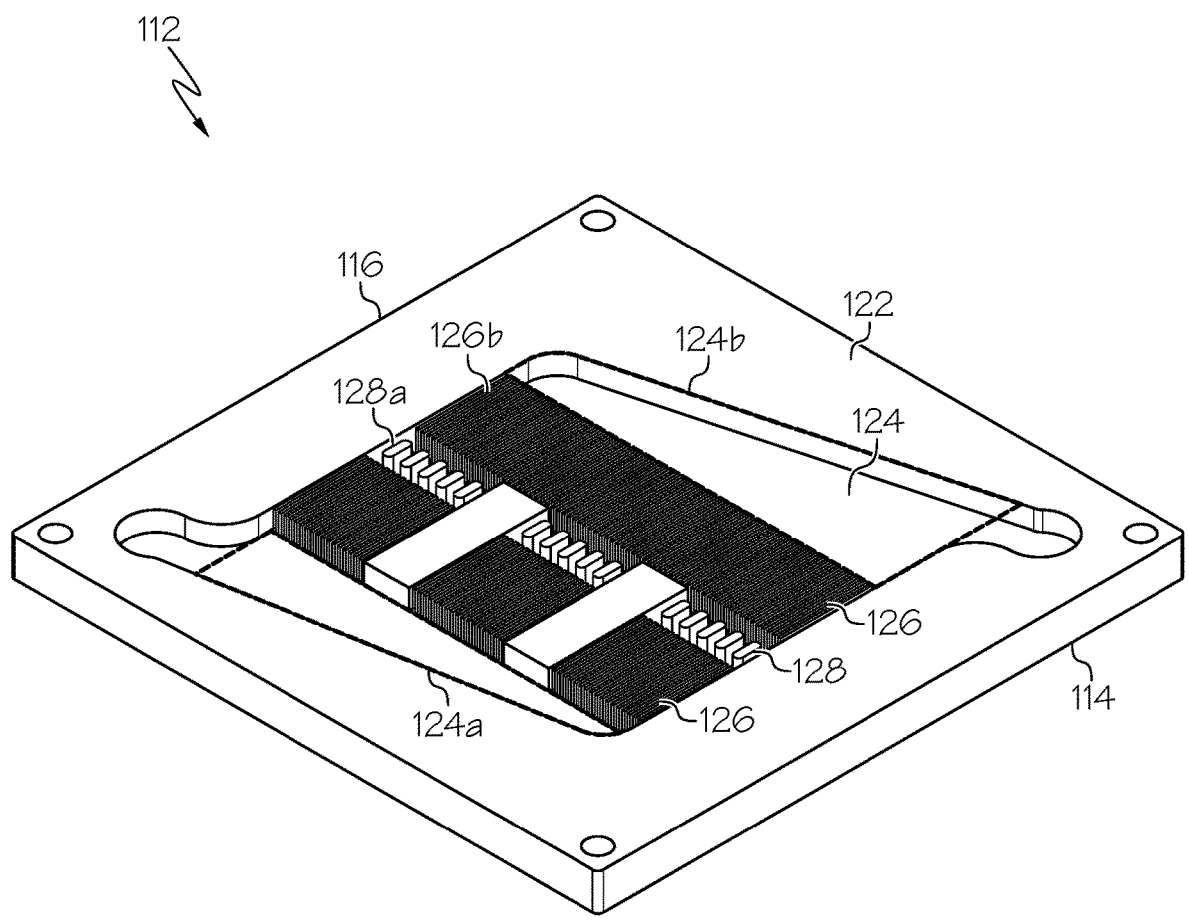
FIG. 3 schematically depicts a perspective view of an illustrative cold plate having a plurality of cavities and heat sinks, according to one or more embodiments shown and described herein.
Figure 4:
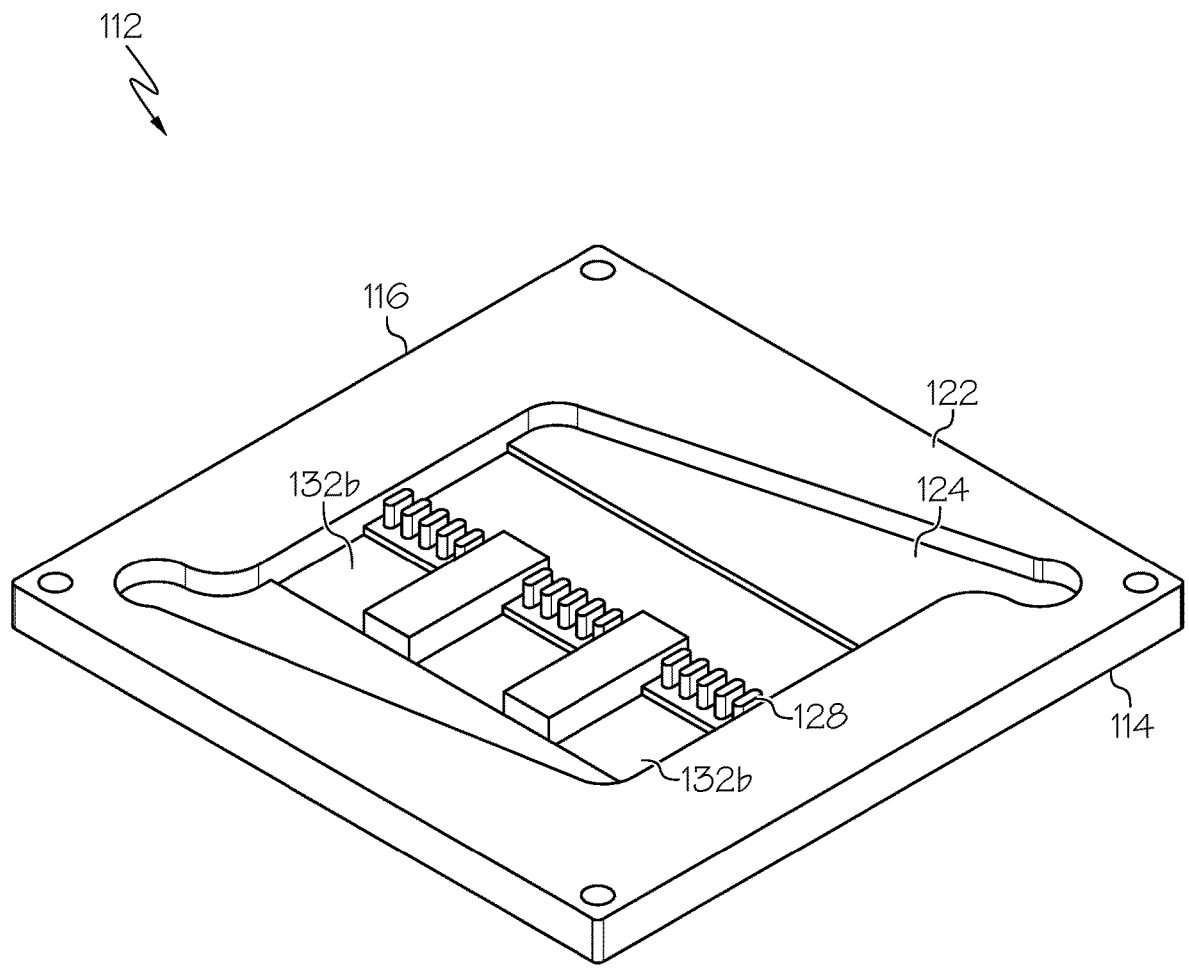
FIG. 4 schematically depicts a top view of an illustrative cold plate having a plurality of cavities and a plurality of pins, according to one or more embodiments shown and described herein.

Referring now to FIG. 3, the coolant pocket 124 is shown. The coolant pockets 124 are defined pockets (e.g., defined through machining, forming, 3D printing, or the like) into the second side 116 of the manifold 122. After coolant enters the manifold 122 via the inlet, the coolant is collected in the coolant pocket 124. The coolant pocket 124 directs the coolant before interacting with the plurality of heat sinks 126, such that the coolant is evenly distributed to the plurality of heat sinks 126. In embodiments, the coolant pocket 124 directs the coolant, such that heat sinks having higher cooling requirements are provided additional coolant.

The coolant pocket 124 defines an inlet wedge-shaped profile 124a downstream of the inlet 118 and before the coolant interfaces with the plurality of heat sinks 126. The inlet wedge-shaped profile 124a has an increasing cross-sectional area as coolant flows from the inlet 118 into the plurality of heat sinks 126, thereby balancing the flow distribution into each of the plurality of heat sinks 126. The coolant pocket 124 also defines an outlet wedge-shaped profile 124b after the coolant interfaces with the plurality of heat sinks 126 and before exiting the coolant pocket 124 through the outlet 120. The outlet wedge-shaped profile 124b has a decreasing cross-sectional area as coolant flows from the plurality of heat sinks 126 to the outlet 120, thereby balancing the flow distribution after interfacing with the plurality of heat sinks 126.

Conventional manifolds for cold plates are composed of electrically conductive materials, such as metal or the like. Accordingly, an electrical insulation layer may be needed between the cold plate and the PCB to prevent power devices of the PCB with varying voltages from electrically shorting. Further, TIM layers may be needed on both sides of the electrical insulation layer to increase the heat flux from the PCB to the manifold. These additional layers result in increased thermal resistance and increased package size of the power electronics assembly.

Figure 5:
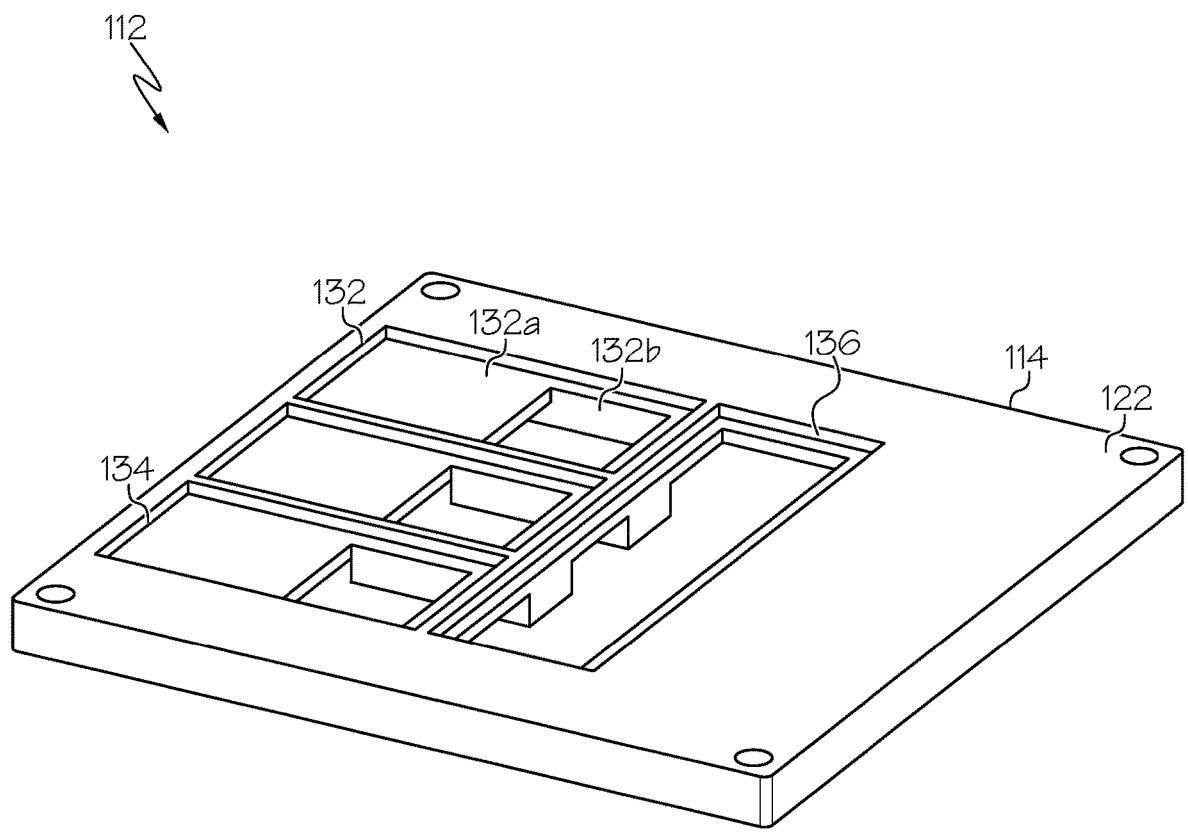
FIG. 5 schematically depicts a first side view of an illustrative cold plate having a plurality of cavities, according to one or more embodiments shown and described herein.
Figure 6:
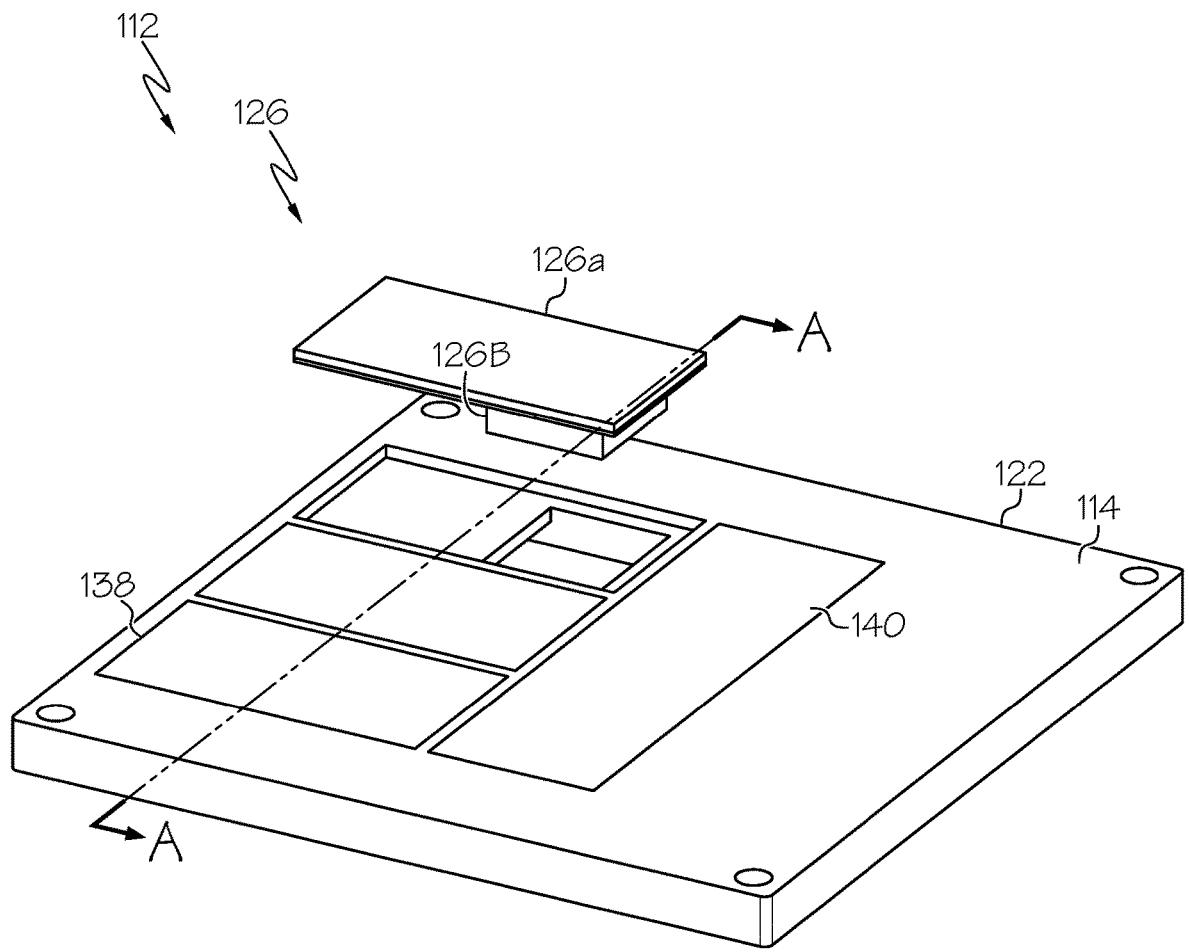
FIG. 6 schematically depicts another first side view of an illustrative cold plate having a plurality of cavities and heat sinks, according to one or more embodiments shown and described herein.

Referring to FIGS. 5-6, the manifold 122 and the plurality of heat sinks 126 are illustrated according to some embodiments. The manifold 122 is generally planar and is constructed from an electrically insulating material, such as plastic, ceramic, or the like. In some embodiments, the manifold 122 is coated with an electrically insulating material. The electrically insulating material electrically isolates the plurality of conductive layers 183 from each other, thereby removing a need for an electrical insulation layer and TIM layers on both sides of the electrical insulation layer. The manifold 122 may be formed through casting, 3D printing, machined, or the like. In some embodiments, a single TIM layer (e.g., such as grease) is placed between the PCB 102 and the cold plate 112.

Due to the decreased thermal resistance in the power electronics assembly 100 and by directly placing the PCB 102 in contact with the cold plate 112, the cooling capacity of the cold plate 112 is increased. Accordingly, the thickness of the cold plate 112 (e.g., a distance from the first side 114 to the second side 116) is decreased. In some embodiments, the cold plate 112 has a thickness of about 5 mm to about 10 mm. In some embodiments, the cold plate 112 has a thickness of about 8 mm to about 12 mm. In some embodiments, the cold plate 112 has a thickness of about 9 mm to about 15 mm. The decreased thickness of the cold plate 112 results in the power electronics assembly 100 having a smaller package size and a more efficient thermal design as compared to conventional designs. Further, the power output of the plurality of power devices may, be increased due to the increased cooling capacity.

As depicted in FIG. 5, the manifold 122 defines a plurality of cavities 132 therein. Each of the cavities 132 may be shaped, sized, and/or arranged such that one of the plurality of heat sinks 126 may be received therein. That is, the shape of each of the plurality of cavities 132 may be formed so that a corresponding heat sink of the plurality of heat sinks 126 is received within the cavity 132 and bonded into place. Each of the plurality of cavities 132 include a recess 132*a* extending along a portion of the manifold 122 to receive a heat sink body 126*a* of each of the plurality of heat sinks 126. Further, each of the plurality of cavities 132 include a through-hole 132*b* extending through a depth of the manifold 122 (e.g., extending from the first side 114 to the second side 116) to receive fins 126*b* of each of the plurality of heat sinks 126. For example, the plurality of cavities 132 may include a first cavity 134 shaped to fit a first heat sink 138 (shown in FIG. 6) of the plurality of heat sinks 126 and a second cavity 136 shaped to fit a second heat sink 140 (shown in FIG. 6) of the plurality of heat sinks 126.

Various bonding techniques may be implemented to bond each of the plurality of heat sinks 126 within a corresponding one of the plurality of cavities 132. For example, induction heating, plastic soldering, sintering, or other bonding processes may be implemented. In some embodiments, the fins 126*b* of each of the plurality of heat sinks 126 include microchannels, plate fins, pin fins, or combination thereof. Each one of the plurality of heat sinks 126 may be made of a thermally conductive material such as aluminum or copper. Each one of the plurality of heat sinks 126 may be machined from a solid block of the thermally conductive material. In some embodiments, each one of the plurality of heat sinks 126 may be forged, extruded, or 3D-printed.

As depicted in FIG. 3, the plurality of pins 128 are positioned between the fins 126*b* of the plurality of heat sinks 126. An upper surface 128*a* of the plurality of pins 128 extends a distance beyond the coolant pocket 124, such that the plurality of pins 128 contact with the cover 130 (FIGS. 1-2) when the cover is installed. The area of contact provides an additional bonding area for bonding the cover 130 to the manifold 122. Each pin of the plurality of pins 128 has planar side surfaces. In some embodiments, the side surfaces are parallel to the fins 126*b* of the plurality of heat sinks 126, thereby decreasing swirl (e.g., reducing eddy currents) in the coolant flow between the plurality of heat sinks 126. In this way, recirculation of coolant flow is mitigated and the coolant flow absorbs greater heat flux from the plurality of heat sinks 126.

Figure 7:
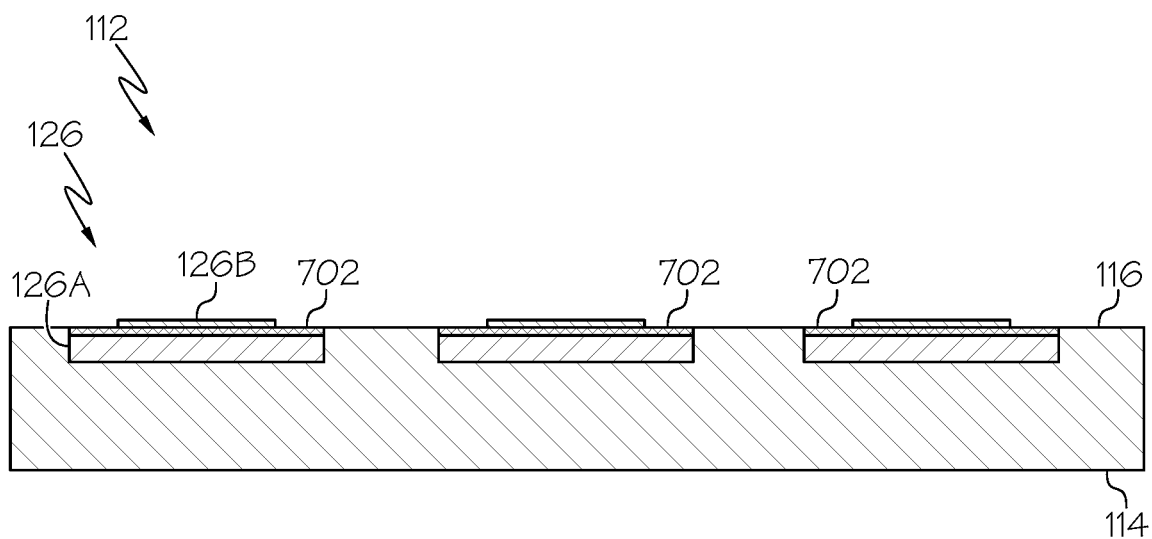
FIG. 7 schematically depicts a cross-sectional side view taken along A-A in FIG. 6 of an illustrative cold plate having an electrical insulation layer on heat sinks, according to one or more embodiments shown and described herein.
Figure 8:
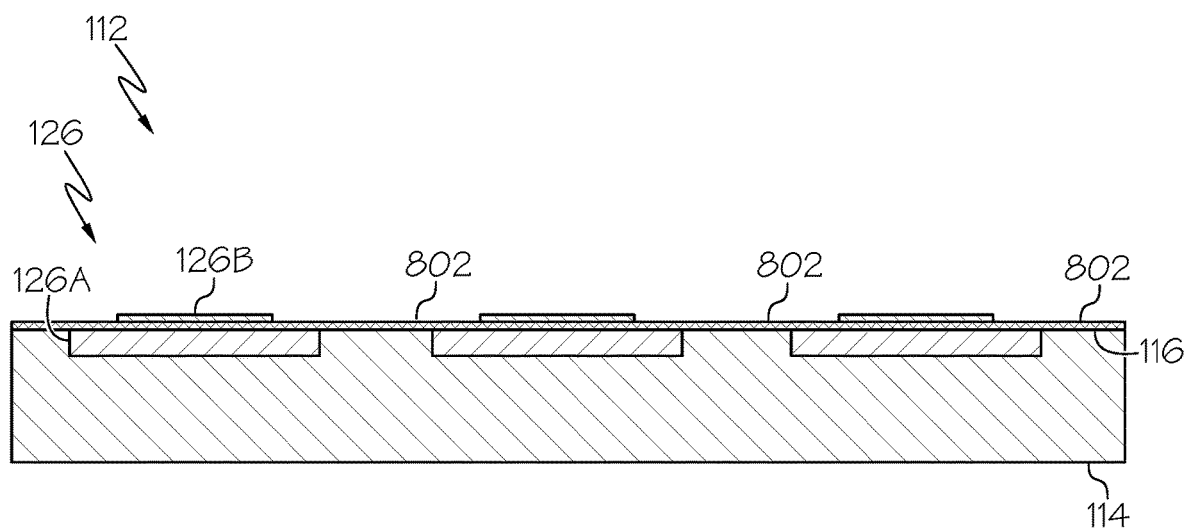
FIG. 8 schematically depicts a cross-sectional side view taken along A-A in FIG. 6 of another illustrative cold plate having an electrical insulation layer throughout the cold plate, according to one or more embodiments shown and described herein.
Figure 9:
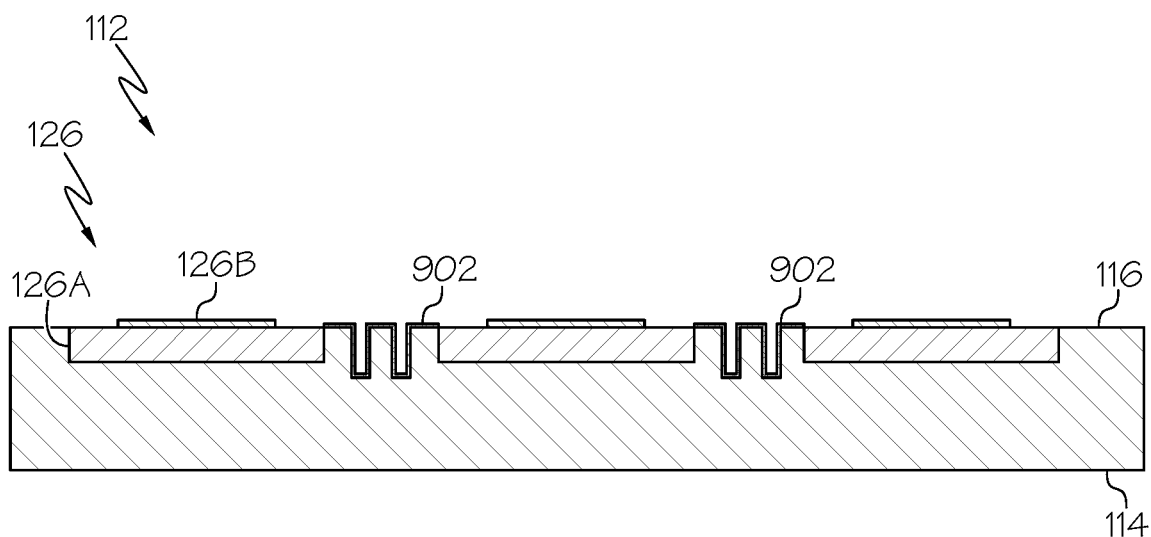
FIG. 9 schematically depicts a cross-sectional side view taken along A-A in FIG. 6 of yet another illustrative cold plate having a plurality of trenches, according to one or more embodiments shown and described herein.

The cold plate 112 depicted in FIGS. 1-6 may have any number of configurations according to the embodiments described herein. FIGS. 7-9 depict various alternative illustrative configurations taken along A-A in FIG. 6. Referring now to FIG. 7, a cross-sectional side view of the cold plate 112 taken along A-A, is shown according to various embodiments. In some embodiments, the heat sink body 126*a* is at least partially coated with a heat sink polyimide coating 702 or any similar coating which improves the adhesion between the plurality of heat sinks 126 to the PCB 102. When the power electronics assembly 100 is assembled, the heat sink polyimide coating 702*a* adheres each of the plurality of heat sinks 126 to the first surface 108, thereby increasing the contact surface area between each of the plurality of heat sinks 126 to the PCB 102. In this way, there are greater rates of thermal flux from the power devices to the plurality of heat sinks 126 via the plurality of conductive layers 183. Further, the heat sink polyimide coating 702 provides a thin electric insulation between the plurality of heat sinks 126 and the PCB 102.

Referring now to FIG. 8, a cross-sectional side view of the cold plate 112 taken along A-A, is shown according to various embodiments. As compared to FIG. 7, instead of coating the heat sink body 126*a*, the second side 116 is at least partially coated with a cold plate polyimide coating 802 or any similar coating which improves the adhesion between the cold plate 112 and the first surface 108. The cold plate polyimide coating 802 may extend along the entire second side 116 (e.g., along the manifold 122 and each heat sink body 126*a*) or partially along the second side 116. When the power electronics assembly 100 is assembled, the cold plate polyimide coating 802 adheres the second side 116 to each of the plurality of heat sinks 126, thereby increasing the contact surface area between each of the plurality of heat sinks 126 to the PCB 102. In this way, there are greater rates of thermal flux from the power devices 170 to the plurality of heat sinks 126 via the plurality of conductive layers 183. Further, the cold plate polyimide coating 802 provides a thin electric insulation between the plurality of heat sinks 126 and the PCB 102.

In conventional systems, a non-dielectric coolant may be needed for higher cooling performance. In the embodiments of the present disclosure, each of the plurality of heat sinks 126 is coated with a dielectric coating layer along each heat sink body 126*a*. The dielectric coating layer may be $SiO_2$ or any other suitable dielectric coating layer. The dielectric coating layer may also include an additional metal coating (e.g., to increase thermal conductivity, increase bonding to the cold plate 112) such as nickel, gold, copper, or the like. In embodiments having the heat sink polyimide coating 702, the heat sink polyimide coating 702 is applied onto the dielectric coating layer.

Referring now to FIG. 9, a cross-sectional side view of the cold plate 112 taken along A-A in FIG. 6, is shown according to various embodiments. In these embodiments, a plurality of trenches 902 are formed within the second side 116. In embodiments, the heat sink polyimide coating 702 described in FIG. 7 or the cold plate polyimide coating 802 in FIG. 8, may be used in conjunction with the plurality of trenches 902. The plurality of trenches 902 are positioned between each of the plurality of heat sinks 126. In electronic assemblies, components may be vulnerable to electronic creepage. Electronic creepage is an electrical path created by two adjacent and conductive components. As components operate at varying voltages, creepage may cause damage to an adjacent component as it may be at a different voltage than the operating voltage of the adjacent component. The plurality of trenches 902 increase a discharge distance between each of the plurality of heat sinks 126 by physically increasing the length between each of the plurality of heat sinks 126. In other words, electric creepage must travel a further depth to an adjacent heat sink of the plurality of heat sinks. Due to this, the plurality of trenches 902 provide additional protection from creepage. In some embodiments, each of the plurality of trenches 902 is defined by a depth (e.g., depth formed into the cold plate 112) of about 0.10 inches to about 0.30 inches. In some embodiments, each of the plurality of trenches 902 defines a depth of about 0.25 inches to about 0.50 inches. In some embodiments, each of the plurality of trenches 902 defines a depth of about 0.50 inches to about 1.00 inches.

Figure 10:
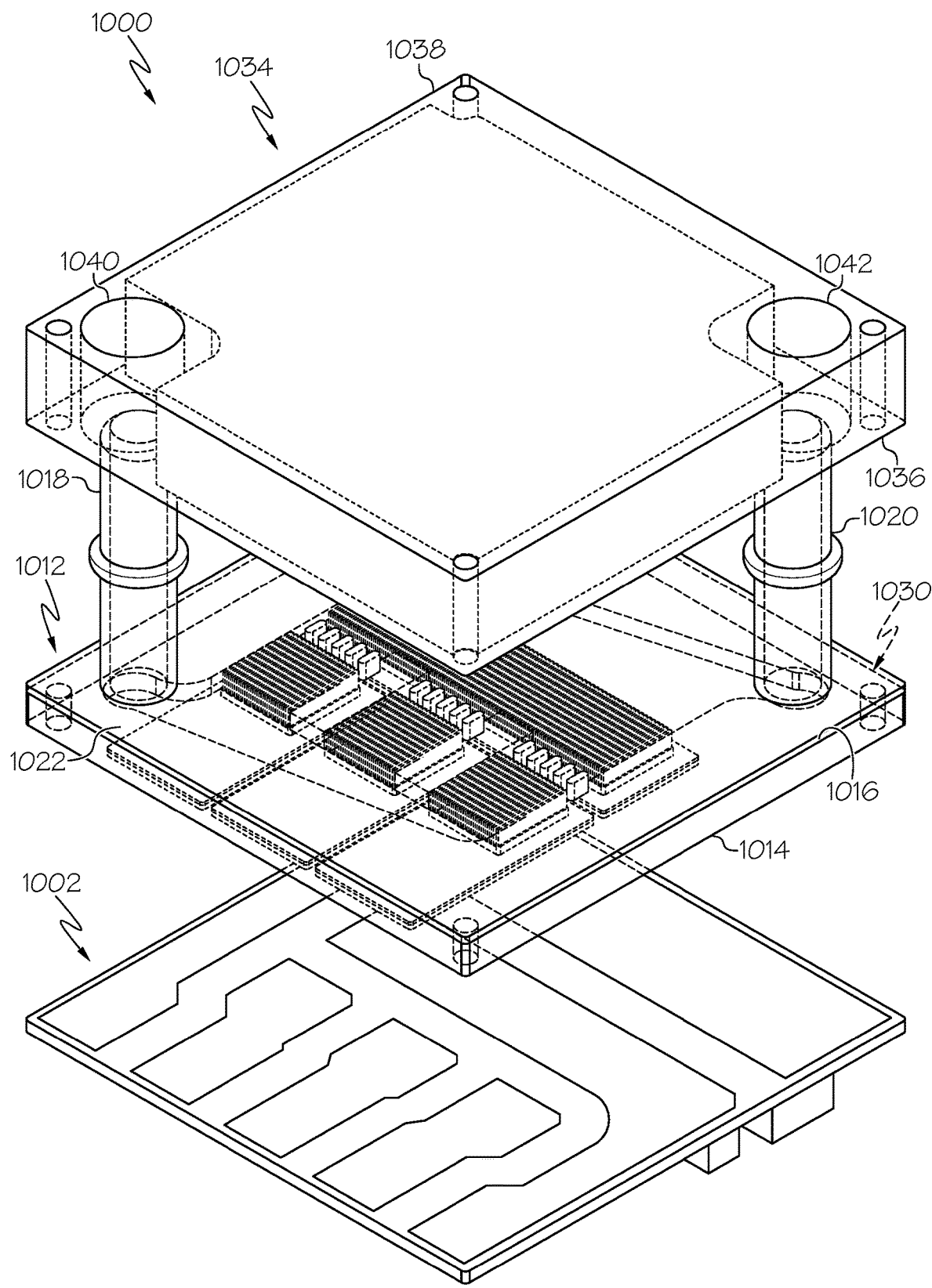
FIG. 10 schematically depicts an exploded perspective view of an illustrative power electronics assembly including a PCB with a plurality of power devices, a cold plate having heat sinks, and a capacitor pack, according to one or more embodiments shown and described herein.

Referring now to FIG. 10, an exploded perspective view of an illustrative power electronics assembly 1000 is shown. The power electronics assembly 1000 includes a PCB 1002 having a plurality of power devices embedded into the PCB 1002. The power electronics assembly 1000 also includes cold plate 1012. The cold plate 1012 includes a manifold 1022 constructed from an electrically insulating material, a first side 1014, a second side 1016 opposite the first side 1014, an inlet 1018, an outlet 1020, a coolant pocket 1124 a plurality of heat sinks 1126, a plurality, of trenches 1128, and a cover 1030. As described, the power electronics assembly 1000 may be substantially similar to the power electronics assembly 100. However, the power electronics assembly may also include a capacitor pack 1034. In embodiments, the power electronics assembly 1000 may use an electric power storage device, such as the capacitor pack 1034.

The capacitor pack 1034 is coupled to the cold plate 1012. In embodiments, the capacitor pack 1034 stores and releases electrical energy to the power electronics assembly 1000. In embodiments, the capacitor pack 1034 stores and releases electrical energy to other devices electrically coupled to the capacitor pack 1034. The capacitor pack 1034 includes a first capacitor side 1036 and a second capacitor side 1038 positioned opposite the first capacitor side 1036. The first capacitor side 1036 is in contact with the second side 1016 of cold plate 1012. The first capacitor side 1036 may be constructed of a material having a high thermal conductivity rate, such as copper, gold, silver, aluminum, or an alloy thereof, thereby increasing the thermal flux from the first capacitor side 1036 to the second side 1016.

The capacitor pack 1034 includes an inlet aperture 1040 and an outlet aperture 1042. Each of the inlet aperture 1040 and the outlet aperture 1042 define through holes extending from the first capacitor side 1036 to the second capacitor side 1038. When the power electronics assembly 1000 is in an assembled state, the inlet 1018 is inserted into the inlet aperture 1040 and the outlet 1020 is inserted into the outlet aperture 1042 such that the inlet 1018 and the outlet 1020 extend though the capacitor pack 1034.

In these embodiments, the power electronics assembly 1000 provides double-sided cooling to both the PCB 1002 and the capacitor pack 1034. As the cold plate 1012 is positioned between the PCB 1002 and the capacitor pack 1034, as well as being thermally coupled to both the PCB 1002 and the capacitor pack 1034, the cold plate 1012 may cool both the PCB 1002 and the capacitor pack 1034. This is advantageous as it reduces a need for a secondary cooling system for the capacitor pack 1034. It is understood that in some embodiments, the power electronics assembly 1000 provides double-sided cooling to both the PCB 1002 and a second PCB (not shown) instead of the capacitor pack 1034. In these embodiments, the inlet aperture 1040 and the outlet aperture 1042 may extend through apertures defined in either the PCB 1002 or the second PCB. In embodiments, the inlet aperture 1040 and the outlet aperture 1042 may extend from side walls of the cold plate 1012.

The capacitor pack 1034 depicted in FIG. 10 may have any number of configurations according to the embodiments described herein. The capacitor pack 1034 may include capacitor fins 1302 extending from one or more surfaces thereof. The capacitor fins 1302 may be constructed of copper, aluminum, or any other suitable material. As discussed in greater detail herein, the capacitor fins 1302 extend through a plurality of apertures 1130 of the cover 1030 (shown in FIGS. 10-11). The capacitor fins 1302 interface with the coolant positioned within the manifold 1022. The capacitor fins 1302 are thermally coupled to the capacitor pack 1034, thereby providing additional cooling to the capacitor pack 1034 when the capacitor fins 1302 interface with the coolant.

Figure 13:
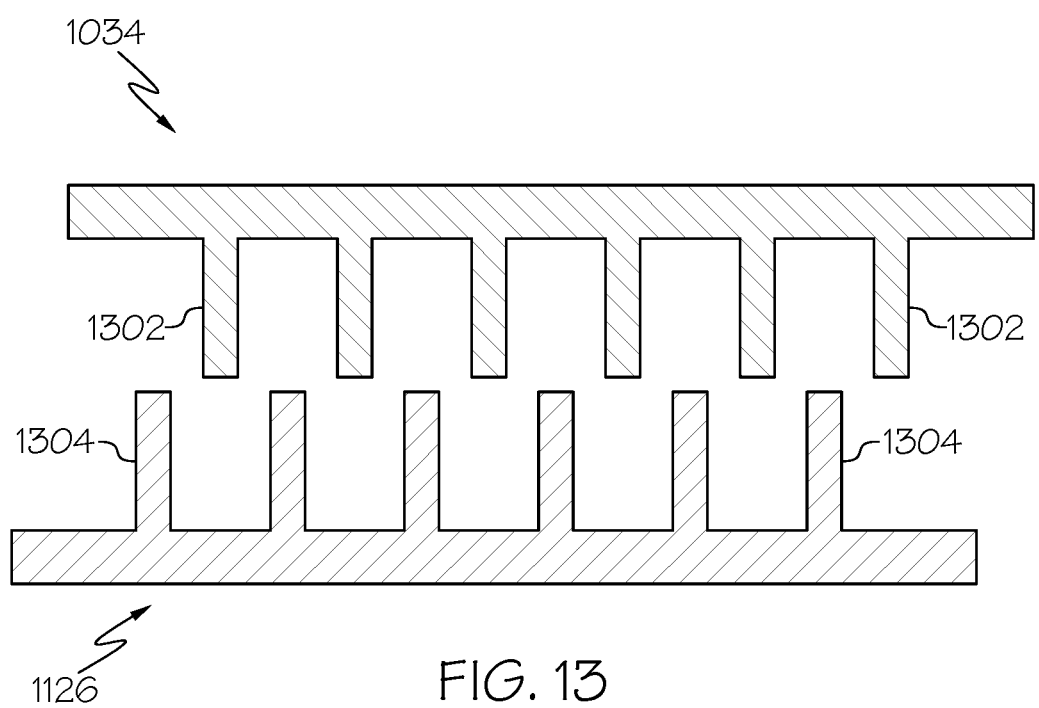
FIG. 13 schematically depicts a cross sectional side view of a plurality of power device pins and a plurality of capacitor pins in a first configuration, according to one or more embodiments shown and described herein.
Figure 14:
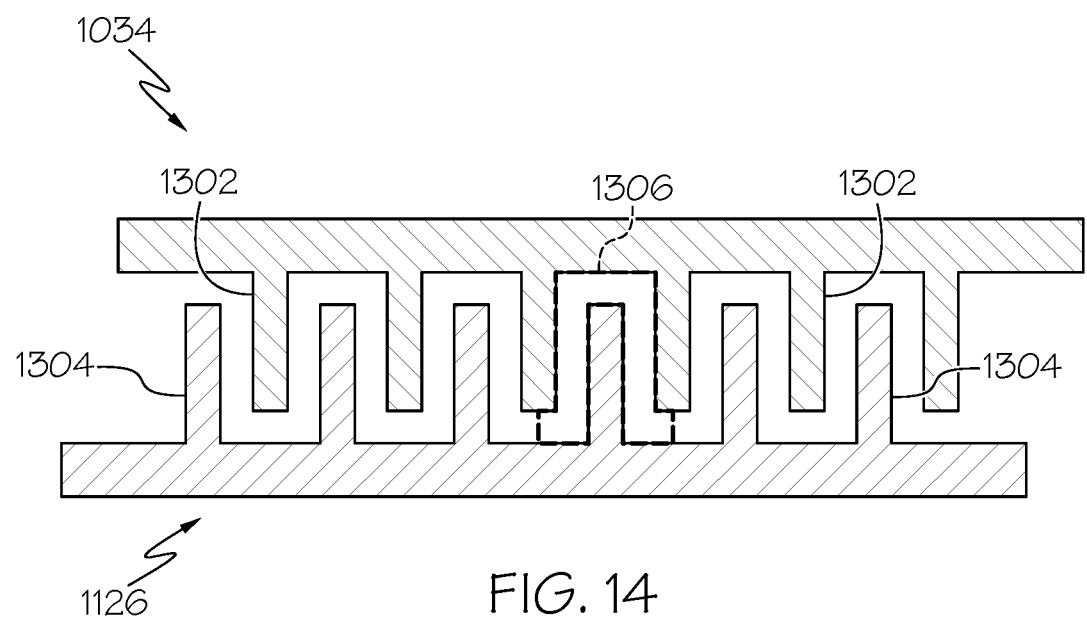
FIG. 14 schematically depicts a cross sectional side view of a plurality of power device pins and a plurality of capacitor pins in a second configuration, according to one or more embodiments shown and described herein.
Figure 15:
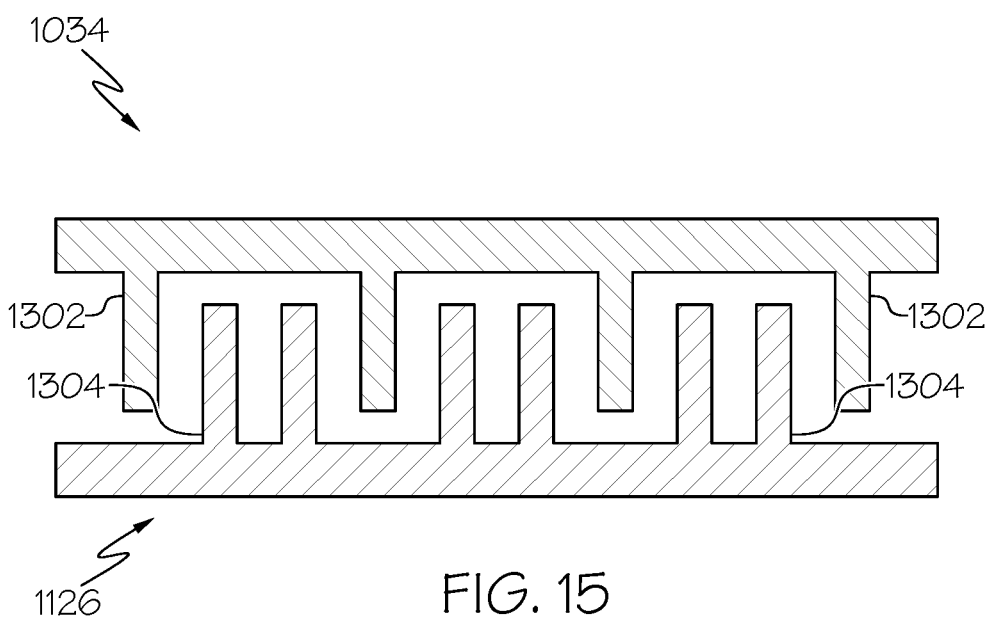
FIG. 15 schematically depicts a cross sectional side view of a plurality of power device pins and a plurality of capacitor pins in a third configuration, according to one or more embodiments shown and described herein.

In conventional systems, different metals that are in contact with each other and are within a corrosive environment (e.g. such as when exposed to coolant in a cold plate 1012) may cause one metal to experience accelerated corrosion. The capacitor fins 1302 and the heat sink fins 1304 of the plurality of heat sinks 1126 are both at least partially positioned within the coolant in the cold plate 1012. In this corrosive environment, the capacitor fin 1302 constructed of a first metal (e.g., aluminum) acts as an anode (e.g., positively charged electrode) and the heat sink fins 1304 are constructed of a second metal (e.g. copper) acts as a cathode (e.g., negatively charged electrode). Electrons travel from the anode to the cathode, which results in the cathode to experience accelerated corrosion. FIGS. 13-15 depict illustrative configurations of the position of the capacitor fins 1302 relative to heat sink fins 1304 for the plurality of heat sinks 1126.

Referring now to FIG. 13, an embodiment is shown in a first configuration where the capacitor fins 1302 are staggered relative to the heat sink fins 1304 in order to prevent the aluminum capacitor fins 1302 to be in contact with the copper heat sink fins 1304. In other words, the aluminum capacitor fins 1302 extend parallel to the copper heat sink fins 1304, but do not make contact with the copper heat sink fins 1304. Coolant enters the manifold 1022 and interfaces with both the capacitor fins 1302 and the heat sink fins 1304, thereby cooling the capacitor pack 1034 and the plurality of heat sinks 1126, respectively. Due to the staggered configuration, the rate of corrosion is reduced.

Referring now to FIG. 14, an embodiment is shown in a second configuration where the capacitor fins 1302 are staggered relative to the heat sink fins 1304 in order to prevent the aluminum capacitor fins 1302 to be in contact with the copper heat sink fins 1304. In other words, the aluminum capacitor fins 1302 extend parallel to the copper heat sink fins 1304, but do not make contact with the copper heat sink fins 1304. In the second configuration each of the capacitor tins 1302 are positioned closer to each of the heat sink fins 1304. This configuration results in a smaller cross-sectional area (e.g., relative to FIG. 13). The smaller cross-sectional area of the fluid channels 1306 result in increased velocity of the coolant as coolant is passed through the fluid channels 1306 between the capacitor fins 1302 and the heat sink fins 1304. The increased velocity results in more coolant to interact with the capacitor fins 1302 and the heat sink fins 1304. This results in increasing cooling rate for the capacitor fins 1302 and the heat sink fins 1304, respectively.

Referring now to FIG. 15, an embodiment is shown in a third configuration where the capacitor fins 1302 and the heat sink fins 1304 are shown in another staggered configuration. As compared to FIGS. 13-14, the capacitor pack 1034 includes less capacitor fins 1302. The number of capacitor fins 1302 may be dependent on the cooling requirements of the capacitor pack 1034. Additionally, by including less capacitor fins 1302, the rate of accelerated corrosion may be reduced as there is less differing metal material positioned in the coolant.

Figure 11:
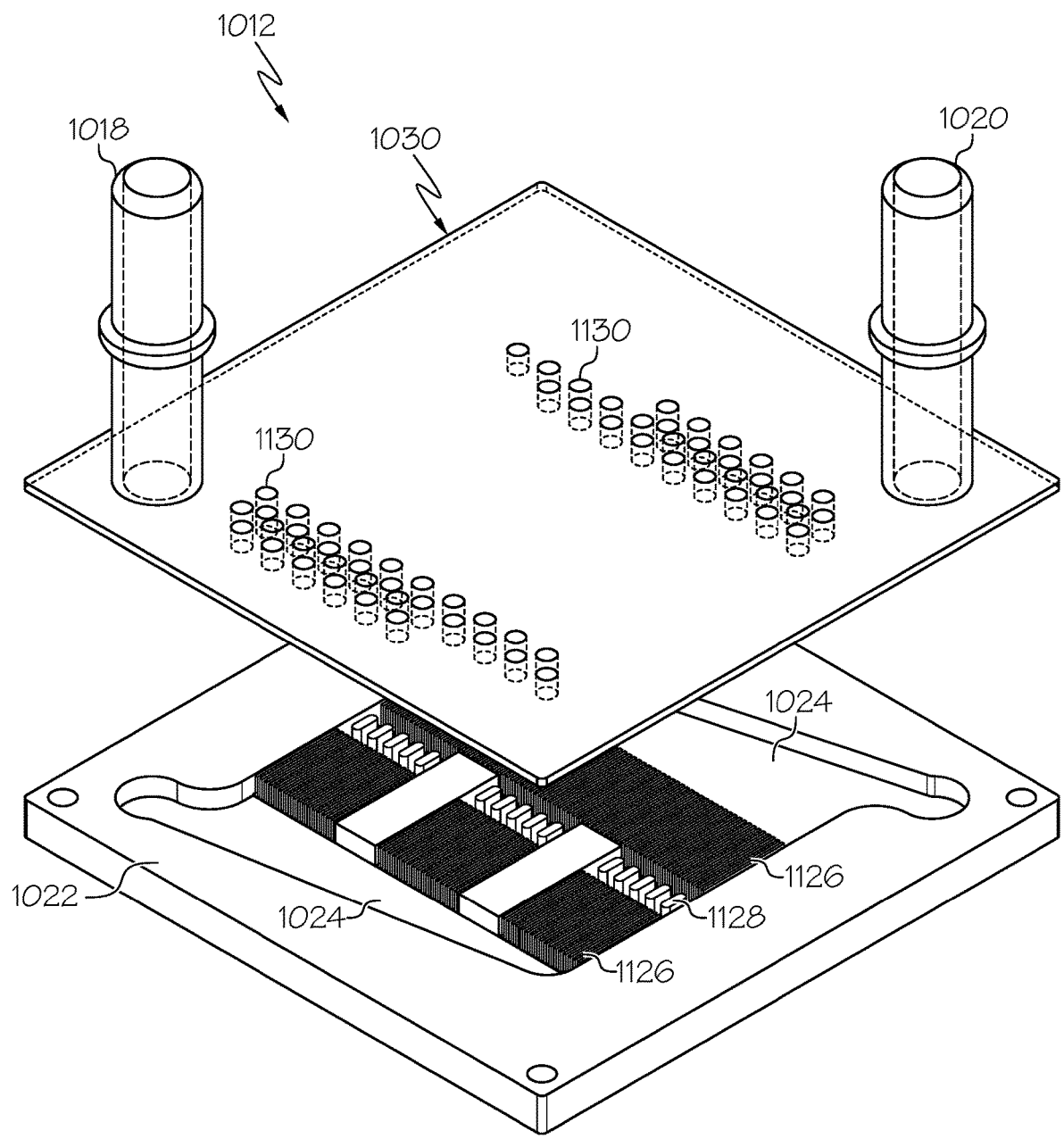
FIG. 11 schematically depicts a cold plate having heat sinks, a plurality of cavities, and a cover having a plurality of apertures, according to one or more embodiments shown and described herein.
Figure 12:
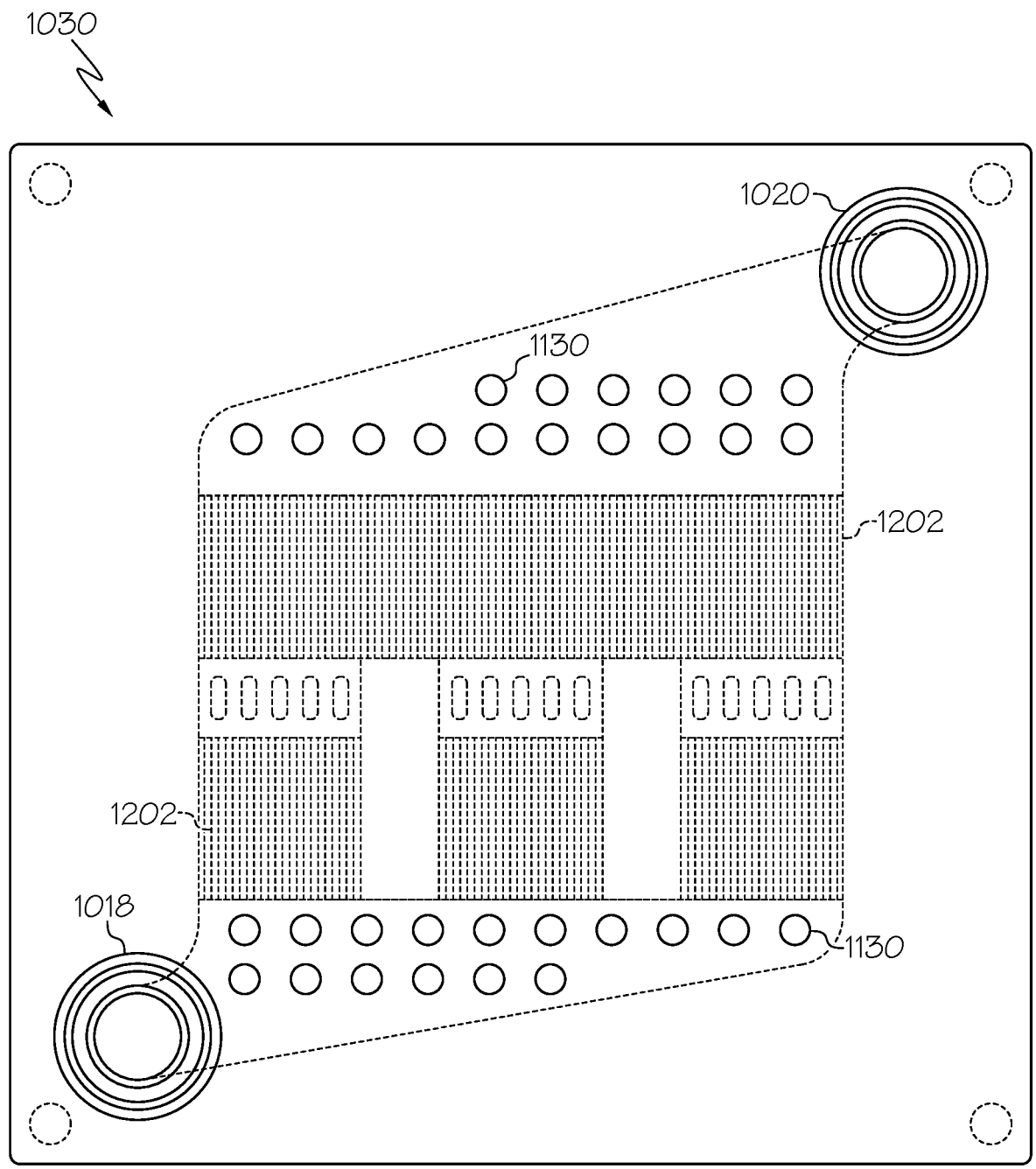
FIG. 12 schematically depicts a cover having a plurality of apertures for a cold plate, according to one or more embodiments shown and described herein.

Referring now to FIGS. 11-12, the cold plate 1012 is shown. In these embodiments, the cover 1030 includes a plurality of apertures 1130 which extend through a depth of the cover 1030. The capacitor fins 1302 (shown in FIGS. 13-15) extend at least partially from the capacitor pack 1034 and through the plurality of apertures 1130. The plurality of apertures 1130 are positioned over the coolant pocket 1024 of the manifold 1022. In this way, the capacitor fins 1302 interface with the coolant to enhance cooling of the capacitor pack 1034.

In some embodiments, the cover 1030 further includes a plurality of fin structures 1202 extending therefrom. The plurality of fin structures 1202 may be constructed of a thermally conductive material such as aluminum or copper. The plurality of fin structures 1202 may extend through an entire depth of the cover 1030. Each of the plurality of heat sinks 1026 are in contact with one of the fin structures 1202, thereby coupling the plurality of heat sinks 1026 to the fin structures 1202. The plurality of fin structures 1202 may then provide the heat received by the plurality of heat sinks 1026 to the other components of the cover 1030. The plurality of fin structures 1202 provide the plurality of heat sinks 1126 an additional cooling path thereby increasing the thermal flux from the capacitor pack 1034 to the cold plate 1012. In this way, the manifold 1022 provides increased cooling capacities.

In these embodiments, additional apertures of the plurality of apertures 1130 are positioned above the plurality of heat sinks 1126 within the manifold 1022. In this way, when the power electronics assembly 1000 is in an assembled state, the capacitor fins 1302 extend through the plurality of apertures 1130. For example, the capacitor fins 1302 may be aligned with the heat sink fins 1304 (e.g., each capacitor fin 1302 is aligned to a heat sink fin 1304).

From the above, it is to be appreciated that defined herein are embodiments directed to a power electronics assemblies that include a printed circuit board (PCB) having a plurality of power devices embedded therein, as well as a cold plate in contact with the PCB. The cold plate has a manifold constructed from an electrically insulating material and cavities in which heat sinks are positioned within. The heat sinks are thermally coupled to the plurality of power devices. The power electronics assemblies described herein avoids or minimizes the need for electrical insulation layers and/or reduce overall thermal resistance. Due to the decreased thermal resistance, the cooling process is more efficient, thereby allowing for the cold plate to be thinner, which results in an overall compact package size that offers improved cooling capabilities. In embodiments, the power electronics assemblies described herein utilize dielectric coolants and can be integrated into other cooling systems that also utilize dielectric coolants, such as a motor cooling system (e.g., in-wheel motor) or the like.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

It will be apparent to those skilled in the art that various modifications and variations can be made to the embodiments described herein without departing from the scope of the claimed subject matter. Thus, it is intended that the specification cover the modifications and variations of the various embodiments described herein provided such modification and variations come within the scope of the appended claims and their equivalents.

What is claimed is:

1. A power electronics assembly comprising:
  a printed circuit board (PCB) having a plurality of conductive layers; and
  a cold plate contacting the PCB and comprising:
    a manifold constructed from an electrically insulating material and comprising a first cavity and a second cavity;
    a first heat sink disposed in the first cavity and contacting a first conductive layer of the plurality of conductive layers; and
    a second heat sink disposed in the second cavity and contacting a second conductive layer of the plurality of conductive layers,
    wherein the first heat sink and the second heat sink have a dielectric coating layer.

2. The power electronics assembly of claim 1, wherein the manifold includes an inlet for dielectric coolant, and wherein the dielectric coolant electrically isolates the first heat sink from the second heat sink.

3. The power electronics assembly of claim 1, wherein the manifold further comprises a plurality of trenches positioned between the first cavity and the second cavity thereby electrically isolating the first cavity from the second cavity, and wherein the plurality of trenches is in contact with the cold plate.

4. The power electronics assembly of claim 1, further comprising a second PCB in contact with the cold plate, the second PCB having a conductive layer thermally coupled to the cold plate.

5. The power electronics assembly of claim 1, further comprising a capacitor pack in contact with the cold plate, the capacitor pack being thermally coupled to the cold plate.

6. The power electronics assembly of claim 5, wherein:
  the cold plate comprises a plurality of apertures,
  the capacitor pack comprises a plurality of fins, and each of the plurality of fins are disposed in an aperture of the plurality of apertures.

7. The power electronics assembly of claim 1, wherein the first heat sink and the second heat sink are directly bonded to the PCB.

8. The power electronics assembly of claim 1, wherein the manifold further comprises a plurality of pins disposed between the first cavity and the second cavity, thereby straightening coolant flow through the first heat sink and through the second heat sink.

9. A power electronics assembly for a vehicle cooling system, the assembly comprising:
　a printed circuit board (PCB) having a plurality of conductive layers; and
　a cold plate contacting the PCB and comprising:
　　an inlet fluidly coupled to a dielectric coolant source;
　　a manifold constructed from an electrically insulating material and comprising a first cavity, a second cavity, and a coolant pocket;
　　a first heat sink disposed in the first cavity and contacting a first conductive layer of the plurality of conductive layers and to the coolant pocket;
　　a second heat sink disposed in the second cavity and contacting a second conductive layer of the plurality of conductive layers and to the coolant pocket, wherein the first heat sink and the second heat sink have a dielectric coating layer; and
　　an outlet fluidly coupled to the coolant pocket.

10. The power electronics assembly of claim 9, wherein the dielectric coolant electrically isolates the first heat sink from the second heat sink.

11. The power electronics assembly of claim 9, wherein the manifold further comprises a plurality of trenches positioned between the first cavity and the second cavity thereby electrically isolating the first cavity from the second cavity, and wherein the plurality of trenches is in contact with the cold plate.

12. The power electronics assembly of claim 9, further comprising a second PCB in contact with the cold plate, the second PCB having a power device thermally coupled to the cold plate.

13. The power electronics assembly of claim 9, further comprising a capacitor pack in contact the cold plate, the capacitor pack being thermally coupled to the cold plate.

14. The power electronics assembly of claim 13, wherein:
　the cold plate comprises a plurality of apertures,
　the capacitor pack comprises a plurality of fins, and
　each of the plurality of fins are disposed in an aperture of the plurality of apertures.

15. The power electronics assembly of claim 9, wherein the first heat sink and the second heat sink are directly bonded to the PCB.

16. The power electronics assembly of claim 9, wherein the manifold further comprises a plurality of pins disposed between the first cavity and the second cavity, thereby straightening coolant flow through the first heat sink and through the second heat sink.

17. A method for fabricating a power electronics assembly, the method comprising:
　creating a first cavity and a second cavity into a manifold of a cold plate and constructed from an electrically insulating material;
　placing a first heat sink in contact with a first conductive layer of a plurality of conductive layers and into the first cavity;
　placing a second heat sink in contact with a second conductive layer of the plurality of conductive layers and into the second cavity, wherein the first heat sink and the second heat sink have a dielectric coating layer;
　placing the plurality of conductive layers onto a printed circuit board (PCB); and
　placing the PCB into contact with the cold plate.

18. The method of claim 17, wherein the manifold is configured to receive dielectric coolant, and wherein the dielectric coolant electrically isolates the first heat sink from the second heat sink.

* * * * *